(12) United States Patent
Kim

(10) Patent No.: US 11,973,053 B2
(45) Date of Patent: Apr. 30, 2024

(54) LASER BONDING SYSTEM AND LASER BONDING APPARATUS

(71) Applicant: Samsung Electronics Co., Ltd., Suwon-si (KR)

(72) Inventor: Geun Woo Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 594 days.

(21) Appl. No.: 17/227,729

(22) Filed: Apr. 12, 2021

(65) Prior Publication Data

US 2022/0068871 A1 Mar. 3, 2022

(30) Foreign Application Priority Data

Sep. 1, 2020 (KR) .................. 10-2020-0110910

(51) Int. Cl.
*H01L 23/00* (2006.01)
*B23K 1/005* (2006.01)
*B23K 26/00* (2014.01)
*B23K 26/03* (2006.01)
*B23K 103/00* (2006.01)

(52) U.S. Cl.
CPC ............ *H01L 24/75* (2013.01); *B23K 1/0056* (2013.01); *B23K 26/009* (2013.01); *B23K 26/03* (2013.01); *B23K 2103/56* (2018.08); *H01L 2224/75263* (2013.01); *H01L 2224/75301* (2013.01); *H01L 2224/75901* (2013.01)

(58) Field of Classification Search
CPC ........... H01L 24/75; H01L 2224/75263; H01L 2224/75301; H01L 2224/75901; H01L 2924/1434; H01L 24/05; H01L 2224/16145; H01L 24/81; H01L 2224/81203; H01L 2224/81224; H01L 2924/14; H01L 2924/1431; H01L 2924/181; H01L 2924/18161; H01L 23/5254; H01L 23/49816; H01L 24/741; H01L 24/89; B23K 1/0056; B23K 26/009; B23K 26/03; B23K 2103/56; B23K 1/0016; B23K 26/034; B23K 3/087
See application file for complete search history.

(56) References Cited

U.S. PATENT DOCUMENTS

| | | | |
|---|---|---|---|
| 7,948,034 B2 | 5/2011 | George et al. |
| 8,242,484 B2 | 8/2012 | Khan |
| 8,488,435 B2 | 7/2013 | Snyder |
| 9,005,388 B2 | 4/2015 | Sugiyama et al. |

(Continued)

*Primary Examiner* — Robert G Bachner
(74) *Attorney, Agent, or Firm* — Harness, Dickey & Pierce, P.L.C.

(57) ABSTRACT

A laser bonding system which improves bonding between a semiconductor chip and a substrate is provided. A laser bonding system comprises a laser bonding apparatus; and a controller configured to control the laser bonding apparatus, wherein the laser bonding apparatus includes a stage which supports a substrate including a pad, and a semiconductor chip including a connection terminal; a pressurizer which moves up and down above the stage; a temperature measuring sensor configured to measure a temperature of the semiconductor chip and generate a temperature value; and a laser radiation apparatus configured to bond a pad of the substrate and a connection terminal of the semiconductor chip, using a laser beam passing through the pressurizer, and the controller lifts the pressurizer in response to the temperature value.

20 Claims, 15 Drawing Sheets

(56) References Cited

U.S. PATENT DOCUMENTS

| | | |
|---|---|---|
| 9,193,138 B2 | 11/2015 | Arai et al. |
| 10,121,760 B2 | 11/2018 | Phillips |
| 10,486,551 B2 | 11/2019 | Nakazaki et al. |
| 2012/0251789 A1 | 10/2012 | Tanaka et al. |

1

LASER BONDING SYSTEM AND LASER BONDING APPARATUS

CROSS-REFERENCE TO RELATED APPLICATION

This application claims priority from Korean Patent Application No. 10-2020-0110910 filed on Sep. 1, 2020 in the Korean Intellectual Property Office, the disclosure of which is incorporated herein by reference in its entirety.

BACKGROUND

1. Field

The present disclosure relates to a laser bonding system and a laser bonding apparatus. For example, at least some example embodiments relate to a laser bonding system and/or a laser bonding apparatus that press a semiconductor chip.

2. Description of the Related Art

A laser bonding apparatus may irradiate a semiconductor chip mounted on a substrate with a laser beam to generate heat in the semiconductor chip. The generated heat may be transferred to a pad of a substrate and a solder bump of the semiconductor chip, and the solder bump may be bonded to the pad. That is, instead of applying heat to bond the semiconductor chip to the substrate, the laser bonding apparatus may irradiate a laser beam so that heat is transferred only to the semiconductor chip.

Recently, semiconductor chips have been made lighter, thinner, shorter and smaller with an increase in degree of integration. For example, recently the thickness of semiconductor chips has become increasingly thinner than the thickness of previous semiconductor chips. As semiconductor chips become thinner, the semiconductor chips may warp when heated by the laser bonding apparatus, and, thus, the semiconductor chips may not operate as needed accordingly. Also, due to the warpage of the semiconductor chips, the solder bump of the semiconductor chips and the pad of the board in the semiconductor package may not be bonded to each other.

SUMMARY

Example embodiments provide a laser bonding system which improves bonding between a semiconductor chip and a substrate.

Example embodiments also provide a laser bonding apparatus that improves the bonding between the semiconductor chip and the substrate.

However, example embodiments of the present disclosure are not restricted to the one set forth herein. Example embodiments and other aspects of the present disclosure will become more apparent to one of ordinary skill in the art to which the present disclosure pertains by referencing the detailed description of the present disclosure given below.

Specific details some non-limiting example embodiments are included in the detailed description and drawings.

According to an example embodiment of the present disclosure, there is provided a laser bonding system including a laser bonding apparatus and a controller. The laser bonding apparatus may include, a stage configured to support a substrate and a semiconductor chip, a pressurizer configured to move up and down above the stage, a temperature measuring sensor configured to measure a temperature of the semiconductor chip, and to generate a temperature value based on the temperature of the semiconductor chip, and a laser radiation apparatus configured to emit a laser beam through the pressurizer to bond a pad of the substrate and a connection terminal of the semiconductor chip, and the controller may be configured to control the laser bonding apparatus to lift the pressurizer based on the temperature value.

According to an example embodiment of the present disclosure, there is provided a laser bonding system including a laser bonding apparatus and a controller. The laser bonding apparatus may include, a stage configured to support a substrate and a semiconductor chip, a pressurizer above the stage, an elevator configured to raise and lower the pressurizer, and a laser radiation apparatus configured to emit a laser beam through the pressurizer to bond a pad of the substrate and a connection terminal of the semiconductor chip; and the controller may be configured to control the laser bonding apparatus to lower the elevator so that the semiconductor chip is pressed by a lower face of the pressurizer, and lift the elevator so that the lower face of the pressurizer is spaced apart from semiconductor chip.

According to an example embodiment of the present disclosure, there is provided a laser bonding apparatus including a stage configured to support a substrate and a semiconductor chip; a transmission on the stage; a support surrounding side walls of the transmission to support the transmission; an elevator configured to raise and lower the support to selectively press a lower face of the transmission into an upper face of the semiconductor chip; first to fourth pressure providers spaced apart from each other on the support to connect the support and the elevator, the first to fourth pressure providers each configured to provide a same pressure to the support; and a laser radiation apparatus configured to emit a laser beam through the transmission to bond a pad of the substrate and a connection terminal of the semiconductor chip.

According to an example embodiment of the present disclosure, there is provided a method for fabricating a semiconductor package including a substrate and a semiconductor chip corresponding thereto, the method including controlling an elevator to lower a pressurizer to bring the pressurizer and the semiconductor chip into contact with each other while the semiconductor chip is on a stage; bonding a connection terminal of the semiconductor chip and a pad of the substrate, using a laser beam transmitted through the pressurizer; and raising the pressurizer when a temperature of the semiconductor chip is greater than or equal to a specific value.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

Hereinafter, example embodiments of the present disclosure will be explained referring to the accompanying drawings.

Figure 1:
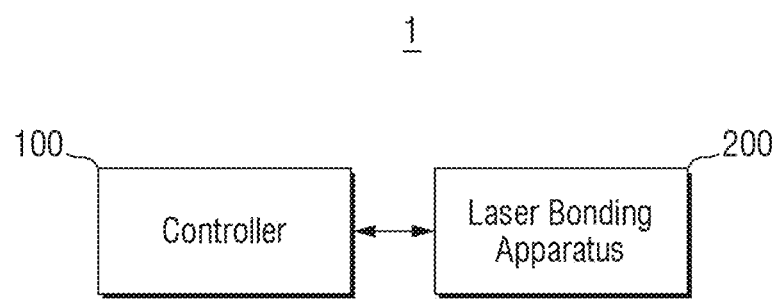
FIG. 1 is a block diagram of a laser bonding system according to some example embodiments.

FIG. 1 is a block diagram of a laser bonding system according to some example embodiments.

Referring to FIG. 1, the laser bonding system 1 may include a controller 100 and a laser bonding apparatus 200.

The laser bonding system 1 may be used during a fabricating process of the semiconductor package. For example, the laser bonding system 1 may bond a semiconductor chip included in the semiconductor package and the semiconductor substrate. Specifically, the laser bonding system 1 may irradiate the semiconductor chip with a laser beam to bond the semiconductor chip and the semiconductor substrate. However, example embodiments of the present disclosure are not limited thereto.

The controller 100 may control the laser bonding apparatus 200. For example, the controller 100 may control the laser bonding apparatus 200 to be turned on or off. The laser bonding process may be performed by turning on and operating the laser bonding apparatus 200 through the controller 100. Further, the laser bonding process may be interrupted by turning off the laser bonding apparatus 200 through the controller 100.

The laser bonding apparatus 200 may perform the laser bonding process through the control of the controller 100. Also, the laser bonding apparatus 200 may provide the controller 100 with the result of monitoring the laser bonding apparatus 200 and a product to be bonded. The controller 100 may analyze the monitoring results and control the laser bonding apparatus 200 through the monitoring results. More detailed examples will be explained later.

Figure 2:
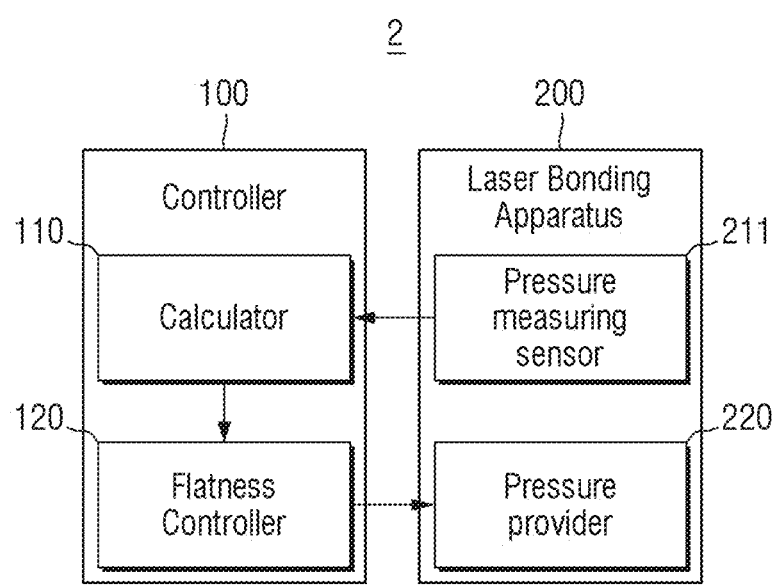
FIG. 2 is a block diagram of a laser bonding system according to some example embodiments.
Figure 3:
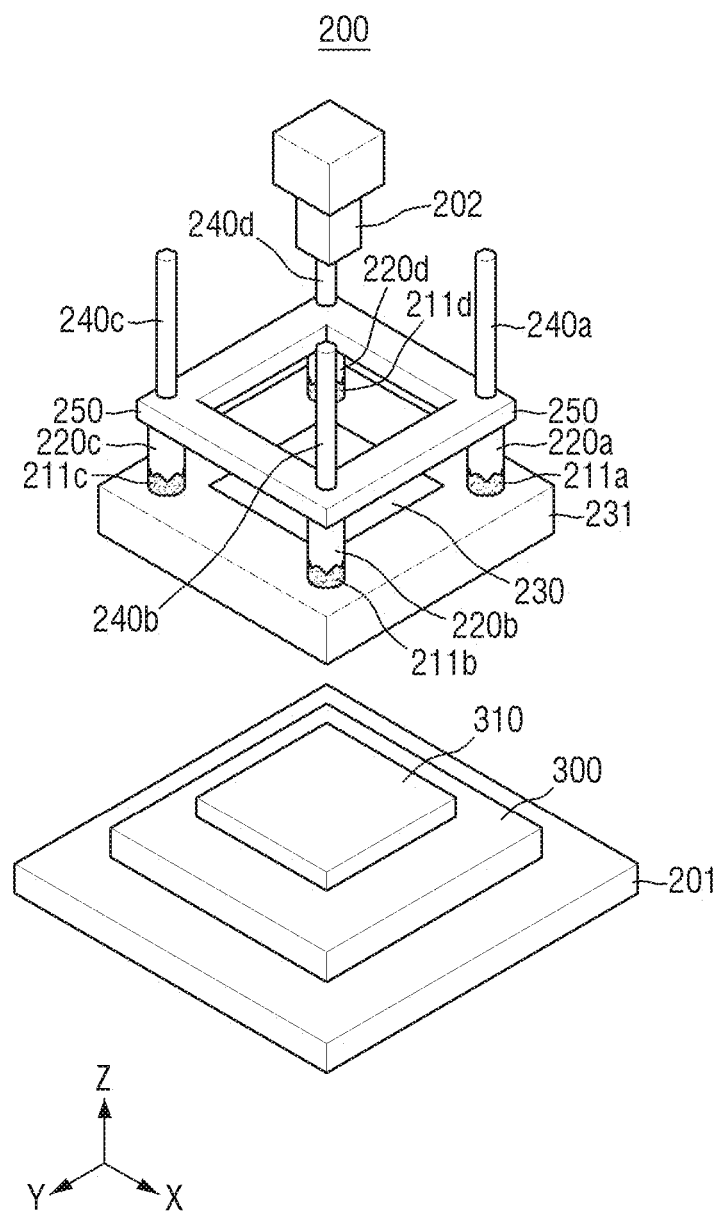
FIG. 3 is a diagram for explaining the laser bonding apparatus according to some example embodiments.
Figure 4:
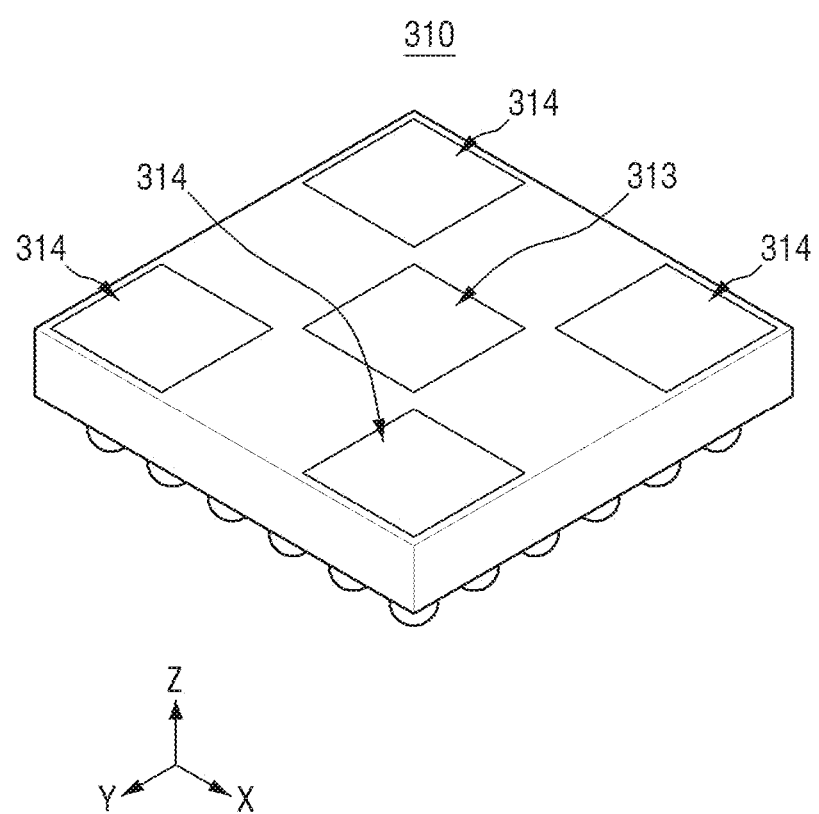
FIG. 4 is a diagram for explaining the semiconductor chip of FIG. 3.
Figure 5:
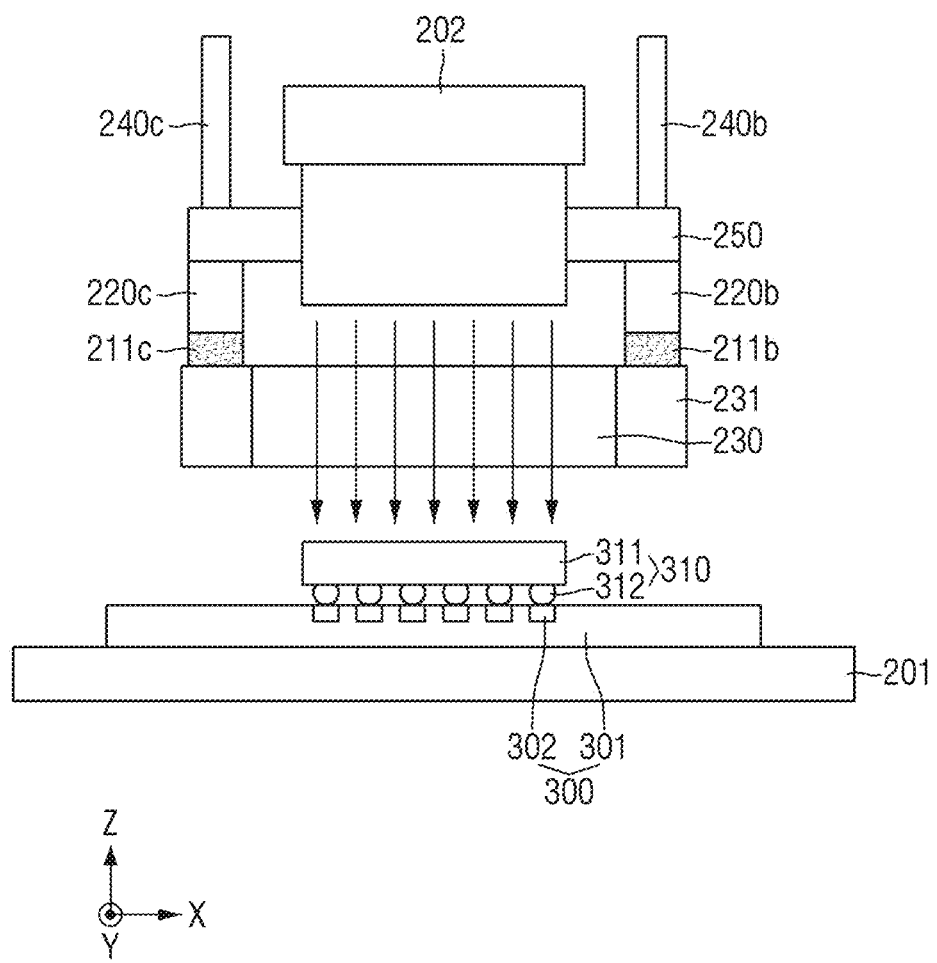
FIGS. 5 and 6 are diagrams for explaining the operation of the laser bonding apparatus according to some example embodiments.
Figure 6:
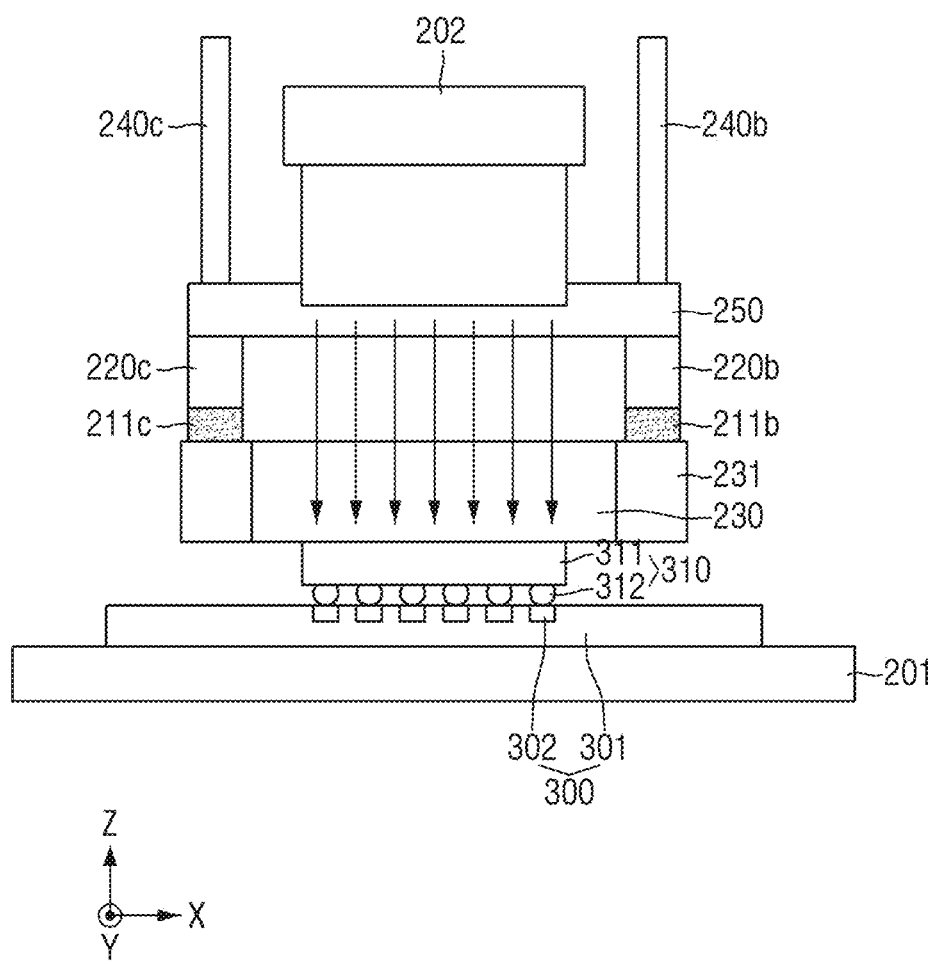

FIG. 2 is a block diagram of a laser bonding system according to some example embodiments. FIG. 3 is a diagram for explaining the laser bonding apparatus according to some example embodiments. FIG. 4 is a diagram for explaining the semiconductor chip of FIG. 3. FIGS. 5 and 6 are diagrams for explaining the operation of the laser bonding apparatus according to some example embodiments.

Referring to FIG. 2, the laser bonding system 2 may include a controller 100 and a laser bonding apparatus 200.

The controller 100 may include processing circuitry such as hardware including logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc.

The controller 100 may include a calculator 110 and a flatness controller 120. For example, according to various example embodiments, each of components included in the controller 100 may be a hardware block including an analog circuit and/or a digital circuit, and may be implemented by the processing circuitry executing software including a plurality of instructions that transform the processing circuitry into special purpose processing circuitry to perform the functions of the components, such as, the calculator 110 and the flatness controller 120.

The laser bonding apparatus 200 may include a pressure measuring sensor 211 and a pressure provider 220.

In some example embodiments, the pressure measuring sensor 211 may provide the pressure measured by the laser bonding apparatus 200 to the controller 100 (e.g., to the calculator 110 included in the controller 100). The calculator 110 may receive and calculate the pressure value measured from the pressure measuring sensor 211. The calculator 110 may provide the result of calculating the measured pressure value to the flatness controller 120. The flatness controller 120 may control the pressure provider 220 on the basis of the provided calculation result. More detailed example will be explained using FIG. 3.

Referring to FIG. 3, the laser bonding apparatus 200 may include a stage 201, a laser radiation apparatus 202, pressure measuring sensors 211a, 211b, 211c and 211d, pressure providers 220a, 220b, 220c and 220d, a transmission 230, a support 231, connections 240a, 240b, 240c and 240d, and an elevator 250.

The stage 201 may be placed below the laser bonding apparatus 200. For example, the stage 201 may be in the form of a plane extending along a first direction X and a second direction Y. The stage 201 may support the substrate 300 and the semiconductor chip 310. The stage 201 may provide a space for allowing the substrate 300 and the semiconductor chip 310 to be bonded to each other.

The substrate 300 may be placed on the stage 201. That is, a lower face of the substrate 300 may come into contact with an upper face of the stage 201. The stage 201 may fix the substrate 300.

The substrate 300 may include a semiconductor substrate. For example, referring to FIG. 5, the substrate 300 may include a body 301 and a pad 302. The body 301 may include a semiconductor device. For example, the body 301 may include an insulating material, a conductive material, impurities and the like. The pad 302 may be electrically connected to the body 301.

For example, the pad 302 may include a conductive material. For example, the pad 302 may include conductive materials such as copper (Cu), aluminum (Al), silver (Ag), tin (Sn), gold (Au), nickel (Ni), lead (Pb), titanium (Ti) or alloys thereof. The pad 302 may be electrically connected to the conductive material or the like of the body 301. However, the example embodiments of the present disclosure are not limited thereto.

Referring to FIG. 3 again, the semiconductor chip 310 may be placed on the substrate 300. That is, the lower face of the semiconductor chip 310 may come into contact with the upper face of the substrate 300.

Referring to FIGS. 4 and 5, the semiconductor chip 310 may include a body 311, a connection terminal 312, a connection pad 313 and a connection pad 314. The body 311 of the semiconductor chip 310 may include a semiconductor device. For example, the body 311 of the semiconductor chip 310 may include an insulating material, a conductive material, impurities and the like.

The semiconductor chip 310 may be, for example, an interposer substrate. Here, the interposer substrate may be a substrate which electrically connects different semiconductor chips to each other.

For example, the connection terminal 312 may be placed on the lower face of the semiconductor chip 310. The connection terminal 312 may include a conductive material. For example, the connection terminal 140 may include solder and the like. The connection terminal 140 may include a land, a ball, a pin, and the like. The number of connection terminals 140 may correspond to the number of pads 302 of the substrate 300. The connection terminal 140 may be placed to correspond to the pad 302 of the substrate 300.

The connection pads 313 and 314 may be placed on the upper face of the body 311. For example, the upper faces of the connection pads 313 and 314 may be exposed to the upper face of the body 311. The connection pad 313 may be placed at the center of the upper face of the semiconductor chip 310. Further, the connection pad 314 may be placed at each corner of the upper face of the semiconductor chip 310. However, the example embodiments of the present disclosure are not limited thereto, and the connection pad 313 and the connection pad 314 may be placed in other forms.

A logic chip may be placed on the connection pad 313. For example, the logic chip may include a central processing unit (CPU), a controller, an application specific integrated circuit (ASIC) and the like.

A memory chip may be placed on the connection pad 314. For example, the memory chip may include a DRAM (Dynamic Random Access Memory), an SRAM (Static RAM), a PRAM (Phase-change RAM), a MRAM (Magneto resistive RAM), a FeRAM (Ferroelectric RAM), a RRAM (Resistive RAM), and the like.

The connection pad 313 and the connection pad 314 may be electrically connected to the connection terminal 312 placed on the lower face. That is, the connection terminal 312 may redistribute the connection pad 313 and the connection pad 314. For example, when the logic chip is electrically connected to the connection pad 313, the logic chip may be electrically connected to the connection terminal 312 through the connection pad 313. Further, for example, when the memory chip is electrically connected to the connection pad 314, the memory chip may be electrically connected to the connection terminal 312 through the connection pad 314.

Further, the logic chip and the memory chip may be electrically connected to each other through the connection pad 313 and the connection pad 314. Accordingly, the logic chip and the memory chip may send and receive data through the semiconductor chip 310. For example, a semiconductor package in which the semiconductor chip 310, the logic chip and the memory chip are electrically connected may be a 2.5D semiconductor package.

A length of the semiconductor chip 310 in the first direction X or the second direction Y may be greater than a length of the logic chip and a memory chip connected to the connection pad 313 and the connection pad 314 of the semiconductor chip 310 in the first direction X or the second direction Y.

For example, the length of the logic chip in the first direction X or the second direction Y may be about 10 mm. Further, for example, the length of the memory chip in the first direction X or the second direction Y may be about 10 mm. On the other hand, the length of the semiconductor chip 310 in the first direction X or the second direction Y may be 40 mm or more. Therefore, the warpage of the semiconductor chip 310 may be greater than that of the logic chip or the memory chip. However, the example embodiments of the present disclosure are not limited thereto, and the length of the semiconductor chip 310 in the first direction X or the second direction Y may be different from that of the embodiment.

Referring to FIG. 3 again, the laser radiation apparatus 202 may be placed on the stage 201. That is, the laser radiation apparatus 202 may be placed to be separated from the stage 201 in the third direction Z. Further, the laser radiation apparatus 202 may be placed to be separated from the substrate 300 and the semiconductor chip 310 in the third direction Z.

The laser radiation apparatus 202 may irradiate a laser beam to a specific region. For example, an area of the laser beam irradiated by the laser radiation apparatus 202 may be substantially the same as an area of the upper face of the semiconductor chip 310. As a result, only the upper face of the semiconductor chip 310 may be irradiated with the laser beam, and the upper face of the substrate 300 not covered with the semiconductor chip 310 may not be irradiated with the laser beam.

The transmission 230 and the support 231 may be placed between the laser radiation apparatus 202 and the stage 201. For example, the transmission 230 and the support 231 may be placed between the laser radiation apparatus 202 and the semiconductor chip 310. The transmission 230 and the support 231 may be called a pressurizer.

The transmission 230 may be in the form of a plane extending in the first direction X and the second direction Y. The transmission 230 may include a transparent material. For example, the transmission 230 may include a quartz. The laser beam emitted from the laser radiation apparatus 202 may pass through the transmission 230 and be irradiated to the semiconductor chip 310.

The transmission 230 may be called a pressurizer. For example, the transmission 230 may descend and come into contact with the upper face of the semiconductor chip 310, and the transmission 230 may press the upper face of the semiconductor chip 310. Although the lower face of the transmission 230 may have a planar shape, the example embodiments of the present disclosure are not limited thereto.

The support 231 may surround the side walls of the transmission 230. For example, the support 231 may support the transmission 230 by being connected to the side walls of the transmission 230. The support 231 does not include a transparent material but may include an opaque material. As a result, the laser beam emitted from the laser radiation apparatus 202 may not pass through the support 231. That is, the laser beam emitted from the laser radiation apparatus 202 may pass through only the transmission 230.

The connections 240a, 240b, 240c and 240d may be connected to the elevator 250. The connections 240a, 240b, 240c and 240d may be controlled so that the elevator 250 ascends and descends.

Referring to FIG. 5, for example, if the length of the connections 240a, 240b, 240c and 240d is reduced, the elevator 250 may ascend. That is, if the length of the connections 240a, 240b, 240c and 240d is reduced, the elevator 250 may move in the third direction Z.

Referring to FIG. 6, for example, if the length of the connections 240a, 240b, 240c and 240d increases, the elevator 250 may descend. That is, if the length of the connections 240a, 240b, 240c and 240d increases, the elevator 250 may move in an opposite direction—Z of the third direction. As the elevator 250 descends, the transmission 230 connected to the elevator 250 may press the upper face of the semiconductor chip 310.

Referring to FIG. 3 again, the elevator 250 may have a closed curved shape including a hole in the center. For example, the laser beam emitted from the laser radiation apparatus 202 may pass through a region defined as the hole of the elevator 250.

The pressure measuring sensors 211a, 211b, 211c and 211d and the pressure providers 220a, 220b, 220c and 220d may be placed between the elevator 250 and the support 231. The pressure measuring sensors 211a, 211b, 211c and 211d and the pressure providers 220a, 220b, 220c and 220d may connect the lower face of the elevator 250 and the upper face of the support 231.

The pressure measuring sensors 211a, 211b, 211c and 211d may be placed on the support 231. Each of the pressure measuring sensors 211a, 211b, 211c and 211d may be placed on the support 231 to be spaced apart from each other. For example, the pressure measuring sensor 211a may be placed at the upper corner of the support 231, the pressure measuring sensor 211b may be placed at the upper corner of the support 231 different from the pressure measuring sensor 211a, the pressure measuring sensor 211c may be placed at the upper corner of the support 231 different from the pressure measuring sensors 211a and 211b, the pressure measuring sensor 211d may be placed at the upper corner of the support 231 different from the pressure measuring sensors 211a, 211b and 211c.

The pressure measuring sensors 211a, 211b, 211c and 211d may be placed to be spaced apart from each other by the same distance. However, the example embodiments of the present disclosure are not limited thereto.

The pressure providers 220a, 220b, 220c and 220d may be placed between the pressure measuring sensors 211a, 211b, 211c and 211d and the elevator 250. That is, the pressure providers 220a, 220b, 220c and 220d may connect the upper faces of the pressure measuring sensors 211a, 211b, 211c and 211d and the lower face of the elevator 250.

The pressure provider 220a may be placed between the pressure measuring sensor 211a and the elevator 250. The pressure provider 220b may be placed between the pressure measuring sensor 211b and the elevator 250. The pressure provider 220c may be placed between the pressure measuring sensor 211c and the elevator 250. The pressure provider 220d may be placed between the pressure measuring sensor 211d and the elevator 250.

The pressure providers 220a, 220b, 220c and 220d may be placed to be spaced apart from each other by the same distance. However, the example embodiments of the present disclosure are not limited thereto.

The pressure providers 220a, 220b, 220c and 220d may provide pressure to the region in which the pressure providers 220a, 220b, 220c and 220d come into contact with the pressure measuring sensors 211a, 211b, 211c and 211d. That is, the pressure providers 220a, 220b, 220c and 220d may provide pressure to each corner of the support 231.

Each of the pressure providers 220a, 220b, 220c and 220d may include a pneumatic regulator, a VCM (voice coil meter), a weight block, a magnet, a metal bellows, a linear motor, and the like. The pressure providers 220a, 220b, 220c and 220d may provide pressure to the support 231 and the transmission 230. In this case, the pressure providers 220a, 220b, 220c and 220d may provide pressure to the area in which the transmission 230 comes into contact with the semiconductor chip 310.

The pressure measuring sensors 211a, 211b, 211c and 211d may measure the pressure between the pressure providers 220a, 220b, 220c and 220d and the support 231. For example, a pressure measuring sensor 211a may measure the pressure between the pressure provider 220a and the support 231. For example, a pressure measuring sensor 211b may measure the pressure between the pressure provider 220b and the support 231. For example, a pressure measuring sensor 211c may measure the pressure between the pressure provider 220c and the support 231. For example, a pressure measuring sensor 211d may measure the pressure between the pressure provider 220d and the support 231.

Referring to FIG. 2, the pressure measuring sensor 211 may provide the measured pressure value to the calculator 110 of the controller 100. For example, a first pressure value between the pressure provider 220a and the support 231 measured by the pressure measuring sensor 211a may be provided to the calculator 110. For example, a second pressure value between the pressure provider 220b and the support 231 measured by the pressure measuring sensor 211b may be provided to the calculator 110. For example, a third pressure value between the pressure provider 220c and the support 231 measured by the pressure measuring sensor 211c may be provided to the calculator 110. For example, a fourth pressure value between the pressure provider 220d and the support 231 measured by the pressure measuring sensor 211d may be provided to the calculator 110.

The calculator 110 may determine whether the provided first to fourth pressure values are equal to each other. When the first to fourth pressure values are not equal to each other, the calculator 110 may provide a command to the flatness controller 120. The flatness controller 120 may control the pressure provider 220 according to the command provided from the calculator 110. Accordingly, the pressure provided by at least one of the pressure providers 220a, 220b, 220c and 220d may change. As the pressure changes, the first to fourth pressure values may become the same.

Figure 7:
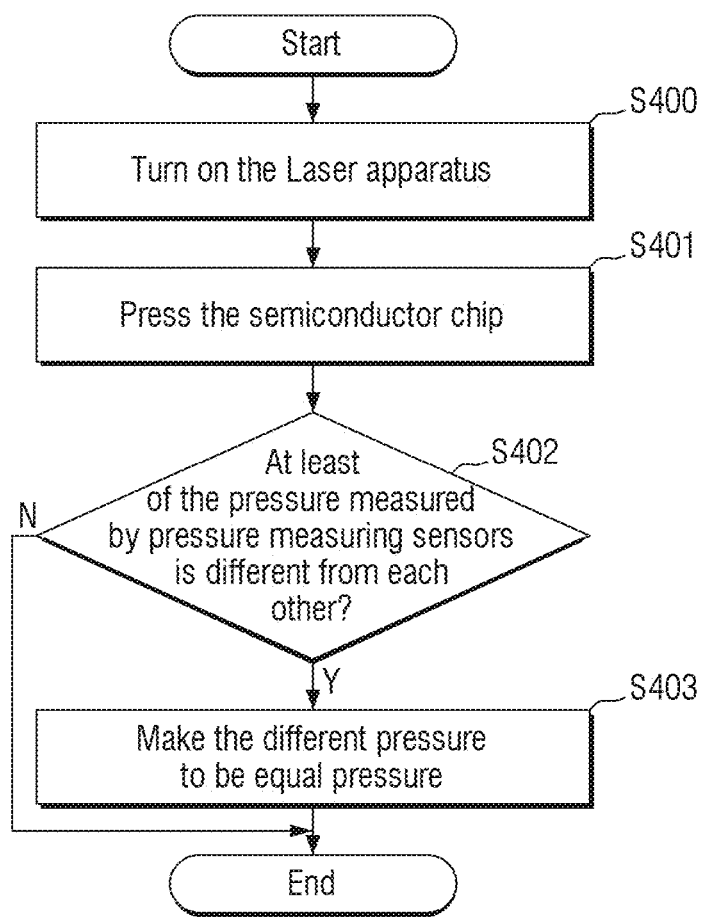
FIG. 7 is a flowchart for explaining the operation of the laser bonding system according to some example embodiments.

FIG. 7 is a flowchart for explaining the operation of the laser bonding system according to some example embodiments.

Referring to FIG. 7, in operation S400, the controller 100 may control the laser boding apparatus 200 to turn on the laser radiation apparatus 202. For example, by turning on the laser radiation apparatus 202, the laser beam emitted from the laser radiation apparatus 202 may pass through the transmission 230 and be irradiated to the upper face of the semiconductor chip 310. The laser beam may increase the temperature of the semiconductor chip 310, and the connection terminal 312 of the semiconductor chip 310 and the pad 302 of the substrate 300 may be bonded accordingly.

In operation S401, the transmission 230 may press the semiconductor chip 310. Referring to FIG. 6, as the elevator 250 descends, the transmission 230 connected to the elevator 250 may also descend. That is, the transmission 230 and the support 231 may descend. As the transmission 230 descends, the lower face of transmission 230 may press the upper face of the semiconductor chip 310. In this case, because the lower face of the transmission 230 is flat, the upper face of the semiconductor chip 310 may be uniformly pressed.

While the upper face of the semiconductor chip 310 is pressed by the transmission 230, the pressure measuring sensors 211a, 211b, 211c and 211d may measure pressure between the pressure providers 220a, 220b, 220c and 220d and the support 231. Also, the pressure measuring sensors 211a, 211b, 211c and 211d may provide the pressure value between the pressure providers 220a, 220b, 220c and 220d and the support 231 to the calculator 110 of the controller 100.

Referring to FIG. 7 again, in operation S402, the controller 100 (e.g., the calculator 110) may determine whether the pressure values measured by the pressure measuring sensors 211a, 211b, 211c and 211d are different from each other.

When the pressure values measured by the pressure measuring sensors 211a, 211b, 211c and 211d are equal to each other, the controller 100 (e.g., the calculator 110) may not instruct the laser bonding apparatus 200 to adjust the pressure applied to semiconductor chip 310.

However, when the pressure values measured by the pressure measuring sensors 211a, 211b, 211c and 211d are different from each other, in operation S403, the controller 100 (e.g., the calculator 110) may provide a command to the flatness controller 120. For example, when the first pressure value measured by the pressure measuring sensor 211a is smaller than the second to fourth pressure values measured by the pressure measuring sensor 211b, 211c and 211d, the calculator 110 may provide the command to the flatness controller 120. Accordingly, the pressure values measured by the pressure measuring sensors 211a, 211b, 211c and 211d may become equal to each other.

The flatness controller 120 may control the pressure provider 220 in response to the command. For example, the pressure provider 220a may increase the pressure provided to the pressure measuring sensor 211a by the control of the flatness controller 120. Accordingly, the pressure values measured by the pressure measuring sensors 211a, 211b, 211c and 211d may become equal to each other. Further, consequently, the portion in which the transmission 230 and the upper face of the semiconductor chip 310 come into contact with each other may be uniformly pressed, and the bonding result of the connection terminal 312 and the pad 302 may be further improved.

The laser bonding method using the laser bonding systems 1 and 2 and the laser bonding apparatus 200 described above may be a method for fabricating the semiconductor package. For example, a semiconductor package may be fabricated by the laser bonding method using the laser bonding systems 1 and 2 and the laser bonding apparatus 200.

Hereinafter, the laser bonding system 3 according to some other example embodiments will be explained referring to FIGS. 8 to 14.

Figure 8:
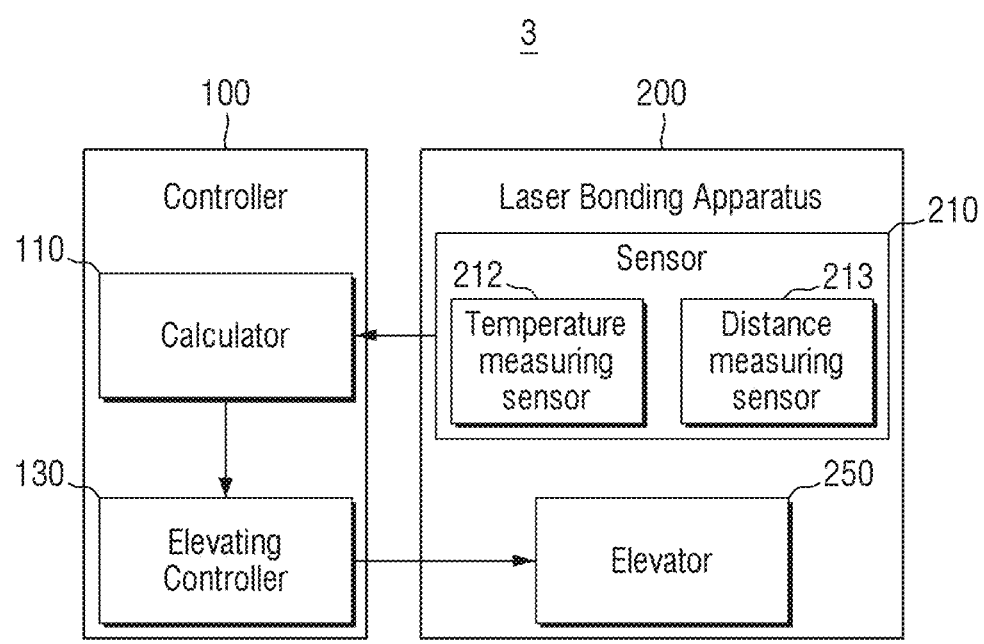
FIG. 8 is a block diagram of a laser bonding system according to some example embodiments.
Figure 9:
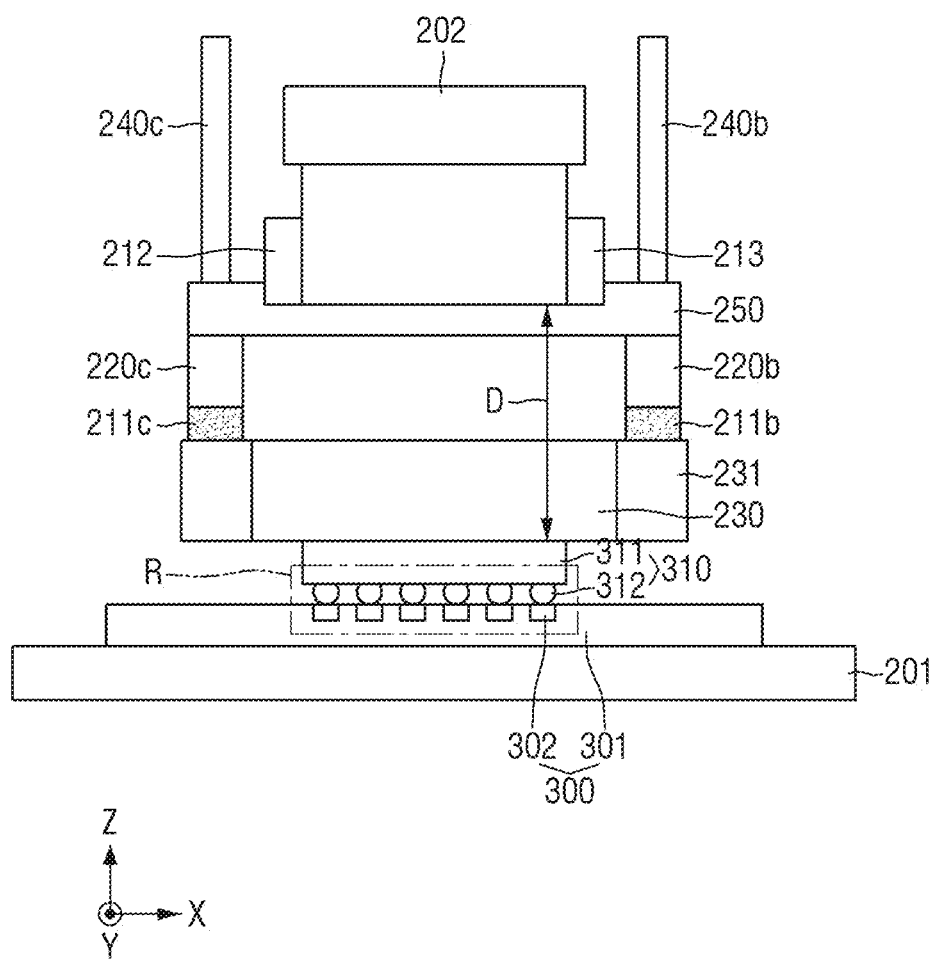
FIGS. 9 and 10 are diagrams for explaining the operation of the laser bonding apparatus according to some example embodiments.
Figure 10:
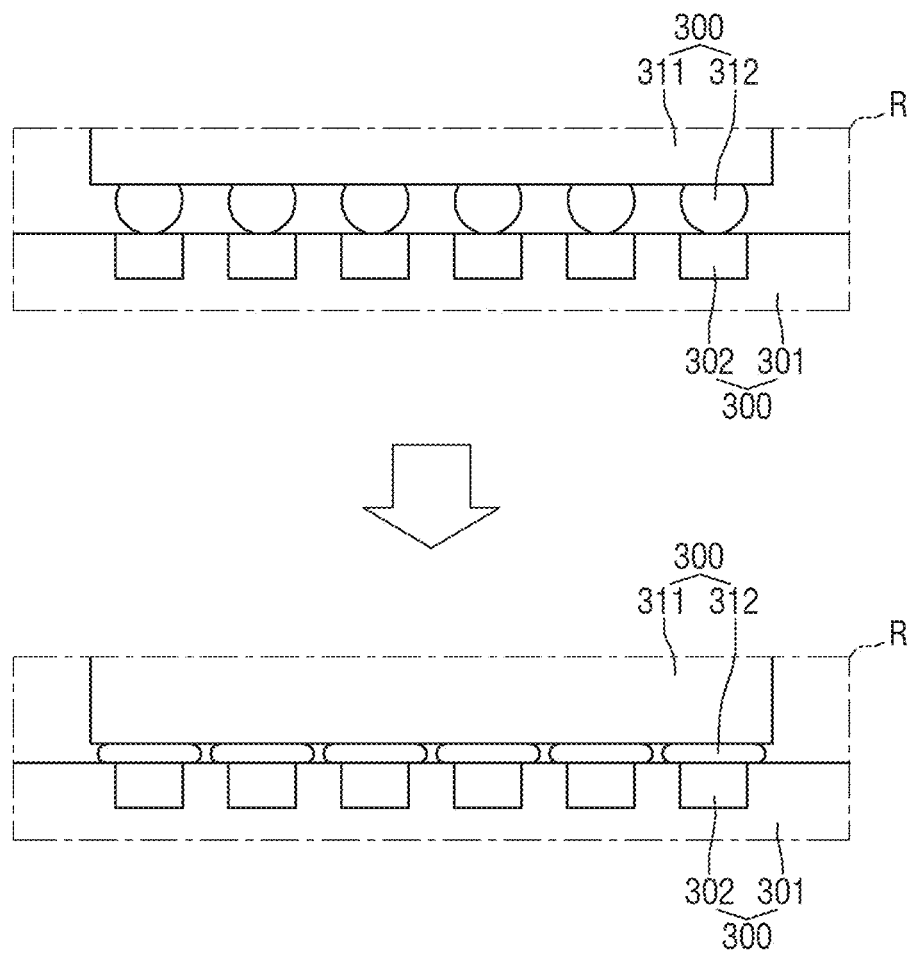
Figure 11:
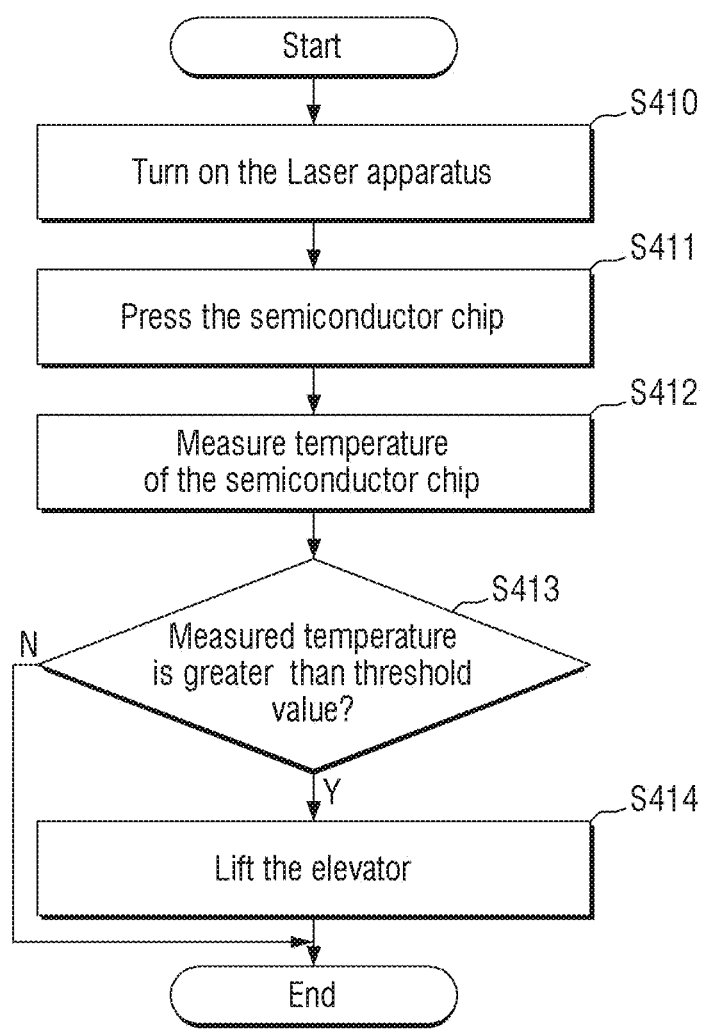
FIG. 11 is a flowchart for explaining the operation of the laser bonding system according to some example embodiments.
Figure 12:
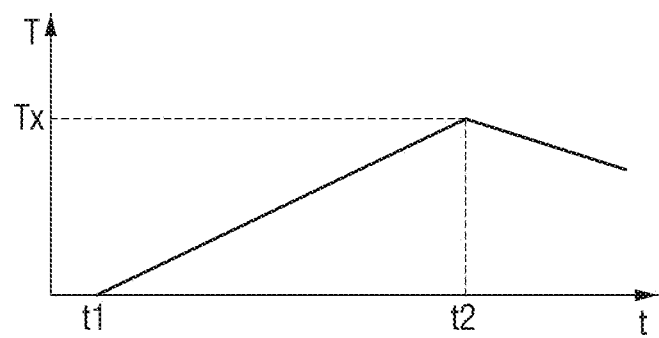
FIG. 12 is a diagram for explaining the operation of the laser bonding system according to some example embodiments.
Figure 13:
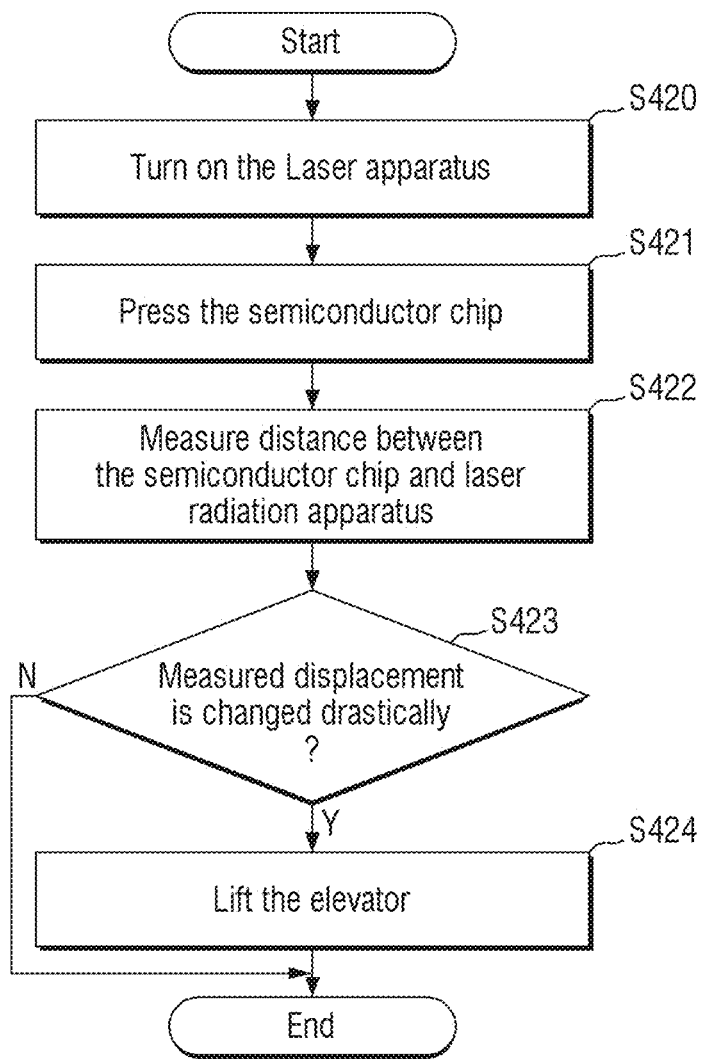
FIG. 13 is a flowchart for explaining the operation of the laser bonding system according to some example embodiments.
Figure 14:
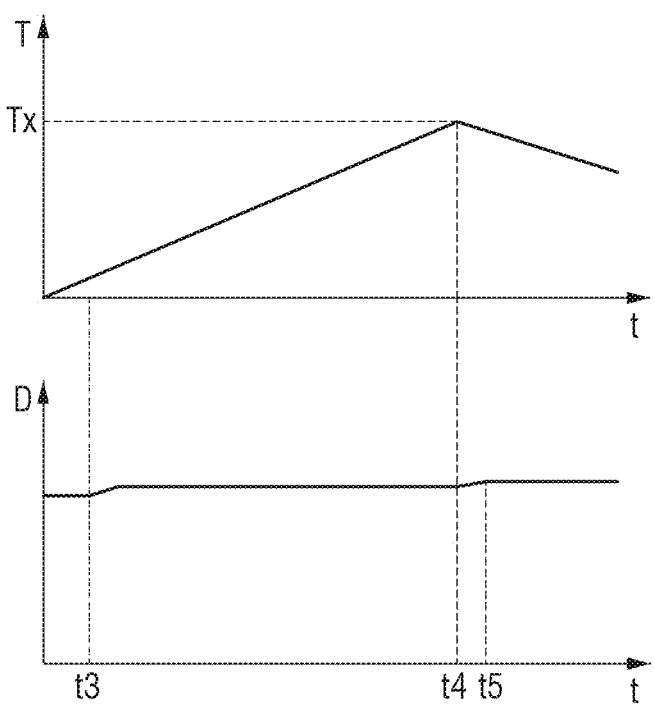
FIG. 14 is a diagram for explaining the operation of the laser bonding system according to some example embodiments.

FIG. 8 is a block diagram of a laser bonding system according to some example embodiments. FIGS. 9 and 10 are diagrams for explaining the operation of the laser bonding apparatus according to some example embodiments. FIG. 11 is a flowchart for explaining the operation of the laser bonding system according to some example embodiments. FIG. 12 is a diagram for explaining the operation of the laser bonding system according to some example embodiments. FIG. 13 is a flowchart for explaining the operation of the laser bonding system according to some example embodiments. FIG. 14 is a diagram for explaining the operation of the laser bonding system according to some example embodiments. For convenience of explanation, repeated parts of contents explained using FIGS. 1 to 7 will be briefly explained or omitted.

Referring to FIG. 8, a laser bonding system 3 may include the controller 100 and the laser bonding apparatus 200.

As discussed above, the controller 100 may be a hardware block including an analog circuit and/or a digital circuit, and may be implemented by the processing circuitry executing software including a plurality of instructions that transform the processing circuitry into special purpose processing circuitry to perform the functions of the components, such as, a calculator 110 and an elevating controller 130.

The laser bonding apparatus 200 may include a sensor 210 and an elevator 250. Here, the sensor 210 may include a temperature measuring sensor 212 and a distance measuring sensor 213.

In some example embodiments, the sensor 210 may provide the value measured by the laser bonding apparatus 200 to the calculator 110. The calculator 110 may receive and calculate the value measured from the sensor 210. The calculator 110 may provide the result of calculating the measured value to the elevating controller 130. The elevating controller 130 may control the elevator 250 on the basis of the provided calculation result. More detailed embodiments will be explained using FIGS. 9 to 14.

Referring to FIG. 9, the laser bonding apparatus 200 may include the temperature measuring sensor 212 and the distance measuring sensor 213. The temperature measuring sensor 212 may be placed adjacent to the laser radiation apparatus 202. The distance measuring sensor 213 may be placed adjacent to the laser radiation apparatus 202.

The temperature measuring sensor 212 may measure the temperature of the semiconductor chip 310 placed on the substrate 300. For example, the temperature measuring sensor 212 may measure the temperature of the upper face of the semiconductor chip 310. The temperature measuring sensor 212 may generate a temperature value of the semiconductor chip 310, and may provide the generated temperature value to the calculator 110 of the controller 100.

The distance measuring sensor 213 may measure the distance between the distance measuring sensor 213 and the semiconductor chip 310. For example, the distance measuring sensor 213 may measure a first distance D, which is a distance between the laser radiation apparatus 202 and the upper face of the semiconductor chip 310. The distance measuring sensor 213 may generate a distance value of the first distance D and may provide the generated distance value to the calculator 110 of the controller 100.

FIG. 10 is an enlarged view of a region R of FIG. 9. Referring to FIG. 10, the connection terminal 312 of the semiconductor chip 310 and the pad 302 of the substrate 300 may be heated by the laser beam. When the laser beam starts to be irradiated to the connection terminal 312 and pad 302, the shapes of the connection terminal 312 and pad 302 may be substantially the same. Subsequently, as the laser beam is irradiated to the connection terminal 312 and the pad 302, the temperature of the connection terminal 312 and the pad 302 may increase.

As the temperature of the connection terminal 312 becomes higher than a specific value, the shape of the connection terminal 312 may be drastically deformed. For example, as the temperature of the connection terminal 312 becomes higher than a specific value, the connection terminal 312 may change from a solid phase to a liquid phase.

When the pressure due to the transmission 230 continues while the connection terminal 312 changes to a liquid phase, the connection terminal 312 may be deformed into a crushed shape by the pressure due to the transmission 230.

When the shape of the connection terminal 312 is deformed, a short circuit may occur between the plurality of connection terminals 312, and connection between the semiconductor chip 310 and the substrate 300 may be defective.

Referring to FIGS. 8, 9 and 11, in operation S410, the controller 100 may control the laser bonding apparatus 200 to turn on the laser radiation apparatus 202. For example, the laser beam emitted from the laser radiation apparatus 202 may pass through the transmission 230 and be irradiated to the upper face of the semiconductor chip 310. Referring to FIG. 12, the laser radiation apparatus 202 may be turned on at a first time t1.

Referring to FIG. 11 again, in operation S411, the controller 100 may control the transmission 230 to press the semiconductor chip 310. As a result, the lower face of transmission 230 may press the connection terminal 312 of the semiconductor chip 310.

In operation S412, the temperature measuring sensor 212 may measure the temperature of the semiconductor chip 310. The temperature measuring sensor 212 may measure the temperature of the semiconductor chip 310 and generate a temperature value, and may provide the generated temperature value to the calculator 110 of the controller 100. For example, the temperature measuring sensor 212 may provide the calculator 110 with the temperature value of the semiconductor chip 310 that is gradually increased by the irradiation of the laser beam. Referring to FIG. 12, the temperature value T of the semiconductor chip 310 may be gradually increased from the first time t1.

Referring to FIG. 11 again, in operation S413, the controller 100 (e.g., the calculator 110) may determine whether the temperature value measured by the temperature measuring sensor 212 is greater than a threshold value. For example, referring to FIG. 12, the calculator 110 may determine whether the temperature value T measured by the temperature measuring sensor 212 is greater than the threshold value Tx.

When the temperature value measured by the temperature measuring sensor 212 is not greater than the threshold value, the controller 100 (e.g., calculator 110) may not instruct the laser bonding apparatus 200 to provide a command to the elevating controller 130. For example, when the temperature value T generated from the first time t1 to the second time t2 is smaller than the threshold value Tx, the calculator 110 may not instruct the laser bonding apparatus 200 to provide a command to the elevating controller 130. Accordingly, the transmission 230 and the upper face of the semiconductor chip 310 may be still in contact with each other.

When the temperature value measured by the temperature measuring sensor 212 is greater than the threshold value, in operation S414, the controller 100 (e.g., the calculator 110) may instruct the elevating controller 130 to control the elevator 250 to ascend. For example, when the temperature value T generated at the second time t2 is greater than the threshold value Tx, the calculator 110 may provide the command to the elevating controller 130. Also, in some example embodiments, the controller 100 may also instruct the laser bonding apparatus 200 to turn off the laser radiation apparatus 202 at the second time t2. As a result, the temperature of the semiconductor chip 310 after the second time t2 may decrease.

For example, as the elevator 250 ascends, the transmission 230 and the upper face of the semiconductor chip 310 may not be in contact with each other. Also, the transmission 230 may not press the upper face of the semiconductor chip 310. That is, when the semiconductor chip 310 becomes greater than the threshold value Tx, because the connection terminal 312 of the semiconductor chip 310 is not pressed, it is possible to inhibit (or, alternatively, prevent) the shape of the connection terminal 312 from changing.

Referring to FIGS. 8, 9 and 13, the elevator 250 may also be controlled based on the distance between the laser radiation apparatus 202 and the upper face of the semiconductor chip 310.

For example, in operation S420, the controller 100 may control the laser bonding apparatus 200 to turn on the laser radiation apparatus 202. For example, the laser beam emitted from the laser radiation apparatus 202 may pass through the transmission 230 and be irradiated to the upper face of the semiconductor chip 310. Referring to FIG. 14, the laser radiation apparatus 202 may be turned on at 0 second.

Referring to FIG. 13 again, in operation S421, the transmission 230 may press the semiconductor chip 310. As a result, the lower face of the transmission 230 may press the connection terminal 312 of the semiconductor chip 310.

In operation S422, the distance measuring sensor 213 may measure the distance between the laser radiation apparatus 202 and the semiconductor chip 310. For example, referring to FIG. 14, as the connection terminal 312 is pressed at the third time t3, the first distance D may increase. That is, the distance between the laser radiation apparatus 202 and the upper face of the semiconductor chip 310 may increase. Further, the first distance D may be maintained constant during the time period from the third time t3 to the fourth time t4. In this case, the connection terminal 312 may be maintained in a solid phase.

The distance measuring sensor 213 may generate a distance value of the first distance D. Referring to FIG. 8, the distance measuring sensor 213 may provide the generated distance value to the calculator 110. The calculator 110 may generate a displacement value on the basis of the provided distance value. Here, the displacement value may mean the value of the distance that has changed during the same time.

Referring to FIG. 13 again, in operation S423, the calculator 110 may determine whether the generated displacement value changes drastically. Referring to FIG. 14, the first distance D may be kept constant during the time period from the third time t3 to the fourth time t4. That is, the displacement value may be 0 during the time period from the third time t3 to the fourth time t4.

During the time period from the fourth time t4 to the fifth time t5, the first distance D may increase drastically. Accordingly, the displacement value during the time period from the fourth time t4 to the fifth time t5 may be greater than 0, which may be a drastic change. The drastic change in the first distance D is due to the change of the connection terminal 312 from the solid phase to the liquid phase.

Referring to FIG. 13 again, when the displacement value does not change drastically, the calculator 110 may not instruct the elevating controller 130 to control the elevator 250. For example, during the time period from the third time t3 to the fourth time t4, the transmission 230 and the upper face of the semiconductor chip 310 may be still in contact with each other.

When the displacement value changes drastically, in operation S424, the calculator 110 may instruct the elevating controller 130 to control the elevator 250 to ascend. For example, when the first distance D increases drastically during the time period from the fourth time t4 to the fifth time t5, the calculator 110 may provide the command to the elevating controller 130. Also, the laser radiation apparatus 202 may be turned off at the fourth time t4. As a result, the temperature of the semiconductor chip 310 may decrease after the fourth time t4.

For example, as the elevator 250 ascends, the transmission 230 and the upper face of the semiconductor chip 310 may not be in contact with each other. Also, the transmission 230 may not press the upper face of the semiconductor chip 310. That is, when the first distance D changes drastically, because the connection terminal 312 of the semiconductor chip 310 is not pressed, the shape of the connection terminal 312 may be inhibited (or, alternatively, prevented) from changing.

Hereinafter, a laser bonding system 4 according to some other example embodiments will be explained referring to FIG. 15.

Figure 15:
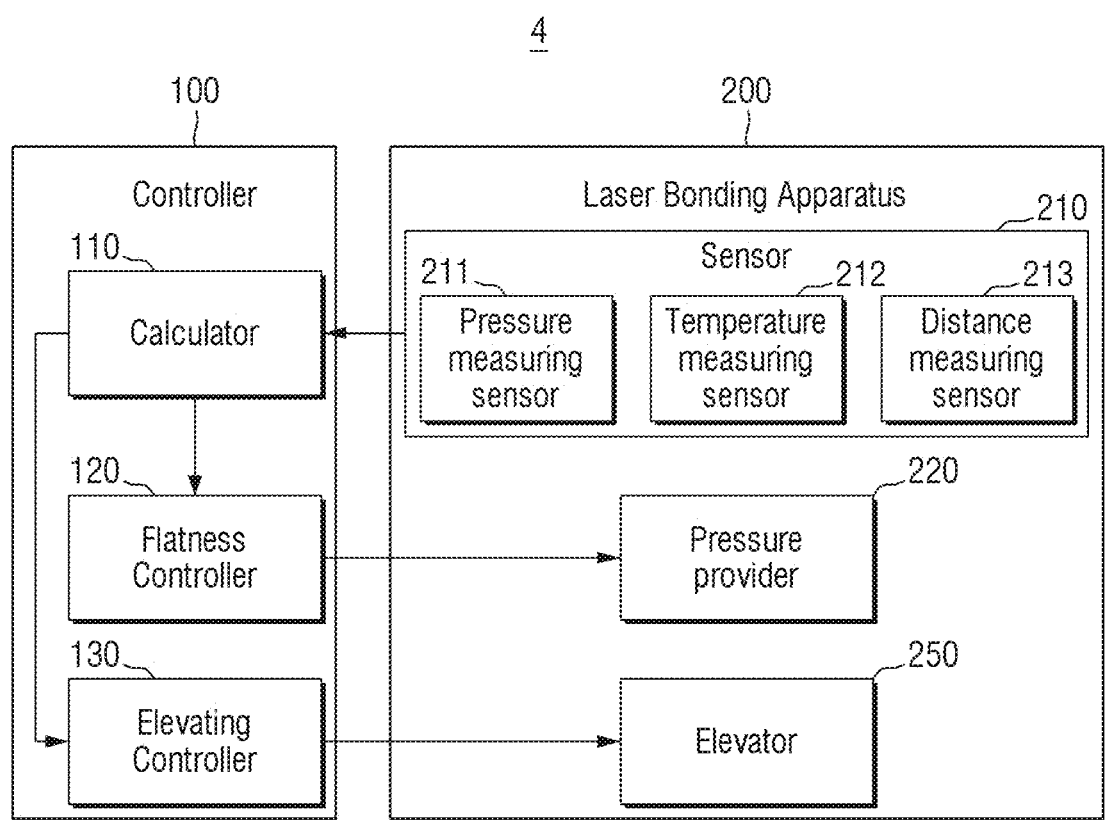
FIG. 15 is a block diagram of a laser bonding system according to some example embodiments.

FIG. 15 is a block diagram of a laser bonding system according to some example embodiments. For convenience of explanation, repeated parts of contents explained using FIGS. 1 to 14 will be briefly described or omitted.

Referring to FIG. 15, the laser bonding system 4 may include a controller 100 and a laser bonding apparatus 200.

As discussed above, the controller 100 may be a hardware block including an analog circuit and/or a digital circuit, and may be implemented by the processing circuitry executing software including a plurality of instructions that transform the processing circuitry into special purpose processing circuitry to perform the functions of the components, such as, a calculator 110, a flatness controller 120 and an elevating controller 130.

The laser bonding apparatus 200 may include a sensor 210, a pressure provider 220 and an elevator 250. Here, the sensor 210 may include a pressure measuring sensor 211, a temperature measuring sensor 212 and a distance measuring sensor 213.

The sensor 210 may generate a measured value of the laser bonding apparatus 200. For example, the pressure measuring sensor 211 may generate a pressure value obtained by measuring the pressure between the pressure provider 220 and the support 231. For example, the temperature measuring sensor 212 may generate a temperature value obtained by measuring the temperature of the semiconductor chip 310. For example, the distance measuring sensor 213 may generate a distance value obtained by measuring the distance between the laser radiation apparatus 202 and the semiconductor chip 310.

The calculator 110 may control the flatness controller 120 or the elevating controller 130 on the basis of the measured values generated from the sensor 210. For example, when the pressure value generated from the pressure measuring sensor 211 satisfies the standard, the controller 100 may control the pressure provider 220 to operate. For example, when the temperature value generated from the temperature measuring sensor 212 or the distance value generated from the distance measuring sensor 213 satisfy the standard, the controller 100 may control the elevator 250 to operate. Example embodiments are not limited thereto, and when the generated pressure value, temperature value, or distance value satisfy the standard, the controller 100 may control the pressure provider 220 or the elevator 250 to operate.

In concluding the detailed description, those skilled in the art will appreciate that many variations and modifications may be made to the example embodiments without substantially departing from the principles of the present disclosure. Therefore, the disclosed example embodiments are used in a generic and descriptive sense only and not for purposes of limitation.

What is claimed is:

1. A laser bonding system comprising:
a laser bonding apparatus including,
a stage configured to support a substrate and a semiconductor chip,
a pressurizer configured to move up and down above the stage,
a temperature measuring sensor configured to measure a temperature of the semiconductor chip, and to generate a temperature value based on the temperature of the semiconductor chip, and
a laser radiation apparatus configured to emit a laser beam through the pressurizer to bond a pad of the substrate and a connection terminal of the semiconductor chip; and
a controller configured to control the laser bonding apparatus to lift the pressurizer based on the temperature value.

2. The laser bonding system of claim 1, wherein the controller is configured to instruct the laser bonding apparatus to lower the pressurizer so that the pressurizer and the semiconductor chip are brought into contact with each other.

3. The laser bonding system of claim 2, wherein the controller is configured to instruct the laser bonding apparatus to lift the pressurizer, in response to the temperature value being greater than or equal to a first specific value.

4. The laser bonding system of claim 3, wherein the controller is configured to interrupt an operation of the laser radiation apparatus, in response to the temperature value being greater than or equal to a second specific value.

5. The laser bonding system of claim 1, wherein the laser bonding apparatus further comprises:
a distance measuring sensor configured to measure a distance between the laser radiation apparatus and the semiconductor chip.

6. The laser bonding system of claim 5, wherein the controller is configured to instruct the laser bonding apparatus to lift the pressurizer based on the distance between the laser radiation apparatus and the semiconductor chip.

7. The laser bonding system of claim 5, wherein the controller is configured to generate a displacement value based on the distance between the laser radiation apparatus and the semiconductor chip, and instructs the laser bonding apparatus to lift the pressurizer based on the displacement value.

8. The laser bonding system of claim 7, wherein the controller is configured to generate the displacement value by,
generating a first displacement value based on the distance between the laser radiation apparatus and the semiconductor chip during a first time period, and
generating a second displacement value based on the distance between the laser radiation apparatus and the semiconductor chip during a second time period subsequent to the first time period, wherein
the first time period is substantially equal to the second time period.

9. The laser bonding system of claim 8, wherein the controller is configured to instruct the laser bonding apparatus to lift the pressurizer, in response to the second displacement value being greater than the first displacement value.

10. A laser bonding system comprising:
a laser bonding apparatus including,
a stage configured to support a substrate and a semiconductor chip,
a pressurizer above the stage, an elevator configured to raise and lower the pressurizer, and a laser radiation apparatus configured to emit a laser beam through the pressurizer to bond a pad of the substrate and a connection terminal of the semiconductor chip; and a controller configured to control the laser bonding apparatus to lower the elevator so that the semiconductor chip is pressed by a lower face of the pressurizer, and lift the elevator so that the lower face of the pressurizer is spaced apart from semiconductor chip.

11. The laser bonding system of claim 10, wherein the lower face of the pressurizer has a planar form.

12. The laser bonding system of claim 10, wherein the pressurizer includes
a transmission configured to transmit the laser beam therethrough;
a support surrounding side walls of the transmission to support the transmission; and
first to third pressure providers each between the support and the elevator and spaced apart from each other.

13. The laser bonding system of claim 12, further comprising:
a first pressure measuring sensor between the first pressure provider and the support;
a second pressure measuring sensor between the second pressure provider and the support; and
a third pressure measuring sensor between the third pressure provider and the support.

14. The laser bonding system of claim 13, wherein the controller is configured to control the first to third pressure provider so that a first pressure value measured by the first pressure measuring sensor, a second pressure value measured by the second pressure measuring sensor, and a third pressure value measured by the third pressure measuring sensor are equal to each other.

15. The laser bonding system of claim 10, wherein the pressurizer includes a transmission configured to transmit the laser beam therethrough, the transmission includes a quartz material.

16. The laser bonding system of claim 10, wherein the stage is configured to support the substrate and the semiconductor chip while the connection terminal of the semiconductor chip corresponds to the pad of the substrate.

17. The laser bonding system of claim 10, wherein the semiconductor chip includes an interposer substrate.

18. The laser bonding system of claim 17, wherein the interposer substrate includes,
a first face having the connection terminal thereon, and
a second face having a plurality of connection pads electrically connected to the connection terminal, the second face being opposite to the first face.

19. A laser bonding apparatus comprising:
a stage configured to support a substrate and a semiconductor chip;
a transmission on the stage;
a support surrounding side walls of the transmission to support the transmission;
an elevator configured to raise and lower the support to selectively press a lower face of the transmission into an upper face of the semiconductor chip;
first to fourth pressure providers spaced apart from each other on the support to connect the support and the elevator, the first to fourth pressure providers each configured to provide a same pressure to the support; and
a laser radiation apparatus configured to emit a laser beam through the transmission to bond a pad of the substrate and a connection terminal of the semiconductor chip.

20. The laser bonding apparatus of claim 19, wherein the lower face of the transmission is a planar form.

* * * * *